(12) United States Patent
Pan et al.

(10) Patent No.: US 7,923,318 B2
(45) Date of Patent: Apr. 12, 2011

(54) HBT AND FIELD EFFECT TRANSISTOR INTEGRATION

(75) Inventors: Noren Pan, Wilmette, IL (US); Andree Wibowo, Des Plaines, IL (US)

(73) Assignee: MicroLink Devices, Inc., Niles, IL (US)

( * ) Notice: Subject to any disclaimer, the term of this patent is extended or adjusted under 35 U.S.C. 154(b) by 398 days.

(21) Appl. No.: 12/069,044

(22) Filed: Feb. 7, 2008

(65) Prior Publication Data
US 2008/0230806 A1    Sep. 25, 2008

Related U.S. Application Data

(60) Provisional application No. 60/900,009, filed on Feb. 7, 2007.

(51) Int. Cl.
*H01L 21/00* (2006.01)
(52) U.S. Cl. .......................... 438/170; 438/172; 438/314
(58) Field of Classification Search ............... 438/170, 438/172, 314
See application file for complete search history.

(56) References Cited

U.S. PATENT DOCUMENTS
7,700,423 B2 * 4/2010 Cooke et al. ............... 438/189
2007/0090399 A1 * 4/2007 Chin et al. ................... 257/197

FOREIGN PATENT DOCUMENTS
EP    0392480 A2    10/1990
EP    1143502 A1    10/2001
JP    10-178117    6/1998

OTHER PUBLICATIONS

International Search Report for Application No. PCT/US2008/001614, dated Sep. 25, 2008.
Dunn, J. et al., "Trends in Silicon Germanium BiCMOS Integration and Reliability," *IEEE 38th Annual International Reliability Physics Symposium*, pp. 237-242 (2000).
Ehwald, K.E. et al., "Modular Integration of High-Performance SiGe:C HBTs in a Deep Submicron, Epi-Free CMOS Process," *IEDM Technical Digest*, pp. 561-564 (1999).
St. Onge, S.A. et al., "A 0.24 μm SiGe BiCMOS Mixed-Signal RF Production Technology Featuring a 47 GHz $f_t$ HBT and 0.18 μm $L_{eff}$ CMOS," *Proceedings of the 1999 Bipolar/BiCMOS Circuits and Technology Meeting*, pp. 117-120 (1999).
Invitation to Pay Additional Fees for Application No. PCT/US2008/001614, dated Jun. 18, 2008.
Hungarian Written Opinion for Application No. 2009051608, dated Aug. 19, 2010.

* cited by examiner

*Primary Examiner* — Laura M Menz
(74) *Attorney, Agent, or Firm* — Nelson Mullins Riley & Scarborough LLP; Anthony A. Laurentano

(57) ABSTRACT

Methods and systems for fabricating an integrated BiFET using two separate growth procedures are disclosed. Performance of the method fabricates the FET portion of the BIFET in a first fabrication environment. Performance of the method fabricates the HBT portion of the BiFET in a second fabrication environment. By separating the fabrication of the FET portion and the HBT portion in two or more separate reactors, the optimum device performance can be achieved for both devices.

24 Claims, 8 Drawing Sheets

| | | Material | Composi-tion | Dopant | Type | Concen-tration (cm$^{-3}$) | Thick-ness (Å) | Layer Descrip-tion |
|---|---|---|---|---|---|---|---|---|
| 532 { 544 { | 523 | InGaAs | >50% | Te | n | >1x10$^{19}$ | 500 | Contact |
| | 522 | InGaAs | Grade | Te | n | >1x10$^{19}$ | 500 | Contact |
| | 521 | GaAs | | Si | n | 4.00x10$^{18}$ | 1000 | Contact |
| | 520 | InGaP | 50 | Si | n | 3.00x10$^{17}$ | 400 | Emitter |
| | 519 | GaAs | | C | P | 4.00x10$^{19}$ | 1000 | Base |
| 542 { | 518 | GaAs | | Si | n | 1.00x10$^{16}$ | 5000 | Collector |
| | 517 | GaAs | | Si | n | 5.00x10$^{16}$ | 4000 | Collector |
| | 516 | GaAs | | Si | n | 3.00x10$^{18}$ | 6000 | SubCollector |
| | 515 | InGaP | 50% | Si | n | 1.00x10$^{18}$ | 150 | |
| 530 { | 514 | GaAs | | Si | n | 3.00x10$^{18}$ | 100 | |
| | 513 | n-GaAs | | Si | n | 2.00x10$^{18}$ | 500 | Contact |
| | 512 | n | | Si | n | 3.00x10$^{17}$ | 200 | Contact |
| | 511 | AlAs | x=1.00 | - | - | | 20 | Etch Stop |
| | 510 | Al$_x$Ga$_{1-x}$As | x=0.24 | - | - | | 200 | Schottky Layer |
| | 509 | Al$_x$Ga$_{1-x}$As | x=0.24 | Si | n | 2.00x10$^{18}$ | 120 | Donor |
| | 508 | Al$_x$Ga$_{1-x}$As | x=0.24 | - | - | | 20 | Spacer |
| | 507 | In$_x$Ga$_{1-x}$As | x=0.16 | - | - | | 120 | Channel |
| | 506 | Al$_x$Ga$_{1-x}$As | x=0.24 | - | - | | 200 | Spacer |
| | 505 | Al$_x$Ga$_{1-x}$As | x=0.24 | Si | n | 2.00x10$^{18}$ | 60 | Donor |
| | 504 | Al$_x$Ga$_{1-x}$As | x=0.24 | - | - | | 200 | Transition |
| 540 { | 503 | 10x Al$_x$Ga$_{1-x}$As | x=0.24 | - | - | | 200 | Super-lattice Buffer |
| | 502 | GaAs | | - | - | | 15 | |
| | 501 | GaAs | | - | - | | 200 | Substrate |

*Fig. 5*

|  | R (mm)= | 0 | 22 | 41 | 43 | Average |
|---|---|---|---|---|---|---|
| Gain | 1KA/sq | 104.48 | 103.25 | 102.16 | 101.78 | 102.92 |
| Base Sheet (ohms/sq) |  | 229.83 | 225.46 | 221.21 | 223.6 | 225.03 |
| Collector Sheet (ohms/sq) |  | 12.79 | 12.75 | 12.67 | 12.59 | 12.7 |
| Emitter Sheet (ohms/sq) |  | 26.83 | 27.54 | 29.17 | 29.68 | 28.3 |
| Base collector breakdown (V) |  | 26.45 | 26.49 | 26.51 | 26.47 | 26.48 |
| Base emitter breakdown (V) |  | 6.47 | 6.47 | 6.47 | 6.41 | 6.45 |
| Collector emitter breakdown (V) |  | 13.22 | 13.23 | 13.27 | 13.01 | 13.18 |

*Fig. 6*

|  | Material | Composition | Dopant | Type | Concentration (cm$^{-3}$) | Thickness (Å) | Layer Description |
|---|---|---|---|---|---|---|---|
| 736 | In$_x$Ga$_{1-x}$As |  | Te |  | >10$^{19}$ | 1000 | Contact |
| 734 | GaAs |  | Si |  | >10$^{19}$ | 500 | Contact |
| 732 | InGaP |  | Si |  | 3x10$^{17}$ | 500 | Emitter |
| 730 | GaAs |  |  |  | 4x10$^{19}$ | 800 | Base |
| 728 | GaAs |  |  |  | 5x10$^{15}$ | 4000 | Collector Region |
| 727 | GaAs |  |  |  | 1x10$^{16}$ | 4000 | Collector Region |
| 726 | GaAs |  | Si |  | 4x10$^{18}$ | 5000 | Sub-collector |
| 724 | InGaP |  | Si |  | 4x10$^{18}$ | 200 | Etch Stop |
| 722 | GaAs |  | Si |  | 3x10$^{17}$ | 500 | Cap |
| 720 | GaAs |  |  |  |  | 200 | Contact |
| 718 | Al$_x$Ga$_{1-x}$As | x=0.24 | Si |  | 2.00x10$^{18}$ | 200 | Schottky Layer |
| 716 | Al$_x$Ga$_{1-x}$As | x=0.24 |  |  |  | 120 | Donor |
| 714 | Al$_x$Ga$_{1-x}$As | x=0.24 |  |  |  | 20 | Spacer |
| 712 | In$_x$Ga$_{1-x}$As | x=0.15 |  |  |  | 120 | Channel |
| 710 | Al$_x$Ga$_{1-x}$As | x=0.24 |  |  |  | 20 | Spacer |
| 708 | Al$_x$Ga$_{1-x}$As | x=0.24 | Si |  | 2x10$^{18}$ | 60 | Donor |
| 706 | Al$_x$Ga$_{1-x}$As | x=0.24 |  |  |  | 200 | Transition |
| 704 | GaAs |  |  |  |  | 2000 | Buffer |
| 702 | GaAs |  |  |  |  |  | Substrate |

*Fig. 7*

| Material | 300K | | 77K | |
|---|---|---|---|---|
| | Hall Mobility ($cm^2$/V-s) | Hall Sheet Resistance ($cm^{-2}$) | Hall Mobility ($cm^2$/V-s) | Hall Sheet Resistance ($cm^{-2}$) |
| PHEMT (Original) | 5.87E+03 | -2.12E+12 | 1.53E+04 | -3.00E+12 |
| BiFET, regular growth | 4.69E+03 | -2.08E+12 | 9.55E+03 | -3.35E+12 |
| BiFET, reduced temperature | 5.61E+03 | -2.44E+12 | 1.40E+04 | -3.42E+12 |

HBT AND FIELD EFFECT TRANSISTOR INTEGRATION

CROSS-REFERENCE TO RELATED APPLICATIONS

This application claims the benefit of and priority from U.S. Provisional Patent Application Ser. No. 60/900,009, filed on Feb. 7, 2007, the entire content of which is incorporated herein by reference.

BACKGROUND

This invention is related in general to device fabrication and in particular to structures and methods for fabricating an integrated HBT/FET device (a "BiFET").

Field effect transistors (FETs) and heterojunction bipolar transistors (HBTs) are two common transistor families. The family of FET transistors includes a number of different FET devices having different structures. Members of the FET family include heterostructure field effect transistors (HFET), homogenous field effect transistors (e.g., MESFET, JFET) and metal oxide semiconductor FET transistors (MOSFET).

Devices from the HBT family and the FET family have advantages and disadvantages that render them more suited to certain applications. For instance, HBT devices have excellent reliability, linearity, and high power capability. This makes an HBT a desirable device technology for power amplifiers and related applications. Meanwhile, a pHEMT (a type of HFET) has operational characteristics that make it a desirable device for a low noise amplifier or a switch and other related applications.

Conventionally, to combine a FET device and an HBT device on a single substrate, multiple growth cycles would be utilized in a common growth environment. However, the resulting BiFET performance is compromised since the growth of highly doped materials from the HBT device introduces impurities into the subsequent growth of the FET device, which limits the reproducibility and control.

There is a need for a fabrication method which results in a BiFET device that has operational characteristics comparable to the operational characteristics of a FET device and an HBT device that are fabricated separately on different substrates.

BRIEF SUMMARY

The present invention addresses the above-described problems associated with the fabrication of a BiFET device. The present invention discloses fabrication methods for forming a FET layered structure and an HBT layered structure on a single common substrate. By forming the FET layered structure and the HBT layered structure in two different fabrication environments according to the teachings disclosed herein, a BiFET device may be fabricated without introducing impurities into the FET portion that detract from the operational characteristics of the FET portion of the BiFET device. By separating the growth of the FET device and the HBT device with a common substrate using two or more separate reactors, the operational characteristics for each device on the BiFET remain comparable to the operational characteristics of FET devices and HBT devices formed separately on different substrates.

The ability to combine the structures of FETs and HBTs onto a single substrate offers a wide variety of structures, operational characteristics, and functions that can be integrated into a compact size, which reduces the total circuit footprint and improves the operational characteristics of the circuit. This has led to the development of transistors that integrate HBTs and FETs in order to take advantage of the strengths of each device type. One potential application for a BiFET device is a Transmitter/Receiver module (T/R module), where a low noise amplifier, a power amplifier, switches, and phase shifters can all be integrated onto a single chip without degrading the operational characteristics of the FET device or the HBT device.

There are a number of advantages to the methods described herein over the conventional single-growth-cycle, common growth environment methodologies. Aside from those advantages already described, the methodologies of the present invention allow the performance of the FET device to be separately evaluated before formation of the HBT device is performed. Moreover, high performance circuits based on either a FET device or an HBT device can be fabricated using a single wafer. In addition, the design and fabrication of FET and HBT devices can be separately optimized without sacrificing performance.

Moreover, the integration of a FET and HBT in accordance with the teachings of the present invention offers numerous mixed signal applications which have been difficult to achieve using conventional methodologies. Conventionally, different functionalities are implemented on a circuit board using separate chips. By integrating functions, such as a power amplifiers, switches, bias controls, and low noise amplifiers, on a single chip, the chip count and packaging cost can be reduced.

According to one embodiment, a method of fabricating a BiFET device is disclosed. The method involves first loading a substrate into a first fabrication environment and forming the FET portion of the BIFET device on the substrate. Second, the substrate is removed from the first fabrication environment and loaded into a second fabrication environment. The HBT portion of the BiFET device is then formed on the substrate in the second fabrication environment. According to one embodiment, the first and second fabrication environments may be molecular beam epitaxy or metal-organic chemical vapor deposition reactors. The first and second fabrication environments can be of different types.

According to another embodiment, the FET portion of the BiFET device is substantially free of contamination from impurities introduced during formation of the HBT portion of the BiFET device. The FET may be from the HFET subfamily, for instance, a pHEMT. In addition, the substrate on which the FET is formed may be one of a GaAs or InP substrate.

According to another embodiment, the temperature is lowered during the forming of the HBT portion of the BiFET device to avoid the degradation of the FET device. The temperature in one embodiment is lowered between 30° C. and 100° C. from a customary temperature used during formation of an HBT device.

According to another embodiment, a reduced oxide desorption process is applied, where the temperature of the substrate is lowered by about 50-100° C. between the formation of the FET and the formation of the HBT to reduce the degradation of the FET device.

According to another embodiment, a BiFET is disclosed, the BiFET being fabricated according to the fabrication methodologies taught herein.

According to another embodiment, a BiFET device is disclosed, the BiFET device comprising a FET device and an HBT device, monolithically integrated on a common substrate. The FET device comprises one or more buffer layers formed on the common substrate, a transition layer formed on the one or more buffer layers, a donor layer, a first spacer layer, a channel, a second spacer layer, a donor layer, a Schottky layer, and a contact layer. The HBT device comprises at least one collector layer, a base layer, an emitter layer, and a contact layer.

BRIEF DESCRIPTION OF THE DRAWINGS

The foregoing and other objects, features and advantages of the invention will be apparent from the following description, and from the accompanying drawings, in which like reference characters refer to the same parts throughout the different views. The drawings illustrate principles of the invention and are not to scale.

FIG. 5 is another exemplary stack up of an illustrative BiFET device formable in accordance with the teachings of the present invention;

FIG. 6 depicts empirical data of the BiFET device depicted in FIG. 5;

FIG. 7 is an exemplary stack up of another illustrative BIFET device formable in accordance with the teachings of the present invention;

DETAILED DESCRIPTION

The present invention discloses fabrication methods for forming and integrated a FET layered structure and an HBT layered structure onto a single common substrate. The FET layered structure and the HBT layered structure are formed in two different fabrication environments on the common substrate. Using this method, a BiFET device may be formed without introducing impurities into the FET portion that detract from the operational characteristics thereof. By separating the growth of the FET device and the HBT device using two or more separate reactors, the operational characteristics for each device forming the BiFET device remain comparable to the operational characteristics of FET devices and HBT devices formed independently and separately on different substrates.

As used herein, the term "FET" refers to heterostructure field effect transistors (HFET), homogenous field effect transistors (e.g., MESFET, JFET), metal oxide semiconductor FET transistors (MOSFET), high electron mobility transistors (HEMT), and pseudomorphic HEMTs (pHEMT) and other like devices.

As used herein, an "HBT" refers to any type of heterojunction bipolar transistor.

As used herein, a "BiFET" refers to a FET and an HBT formed on a common substrate. That is, a BiFET is a monolithically integrated Bipolar HBT and FET.

As used herein, the symbol "≦" means "less than or about equal to."

Figure 1:
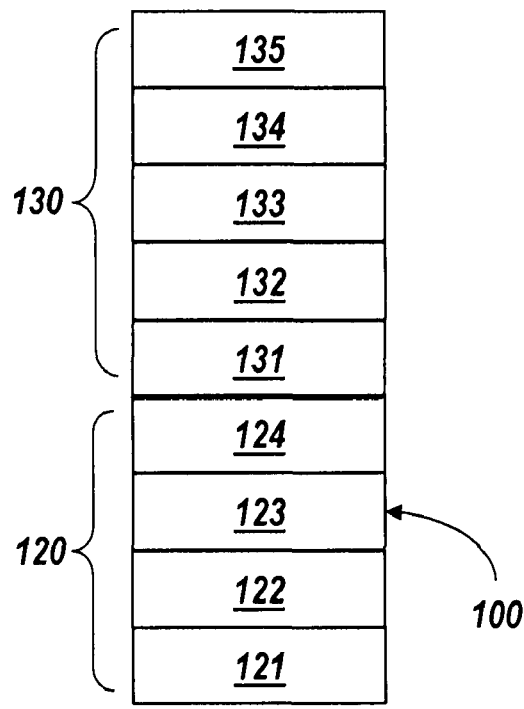
FIG. 1 is an exemplary stack up of an illustrative BiFET device formed in accordance with the teachings of the present invention.

FIG. 1 depicts an exemplary stack up 100 of an illustrative FET 120 formed in a first fabrication environment (i.e., a reactor) and an HBT 130 formed on the same substrate as FET 120 in a second fabrication environment. The HBT 130 may be grown on top of the FET 120, or adjacent to the FET 120.

The FET 120 can include a substrate layer 121 made of semi-insulating material, a buffer layer 122, a spacer layer 123, and a cap layer 124. The HBT 130 can include a collector layer 132, a base layer 133, an emitter layer 134, and a contact layer 135. The substrate 121 may be a GaAs material, an InP material, a GaSb material, an InAs material, a GaP material, a GaN material, a sapphire material, or any other material suitable for fabricating the BiFET 100.

Figure 2:
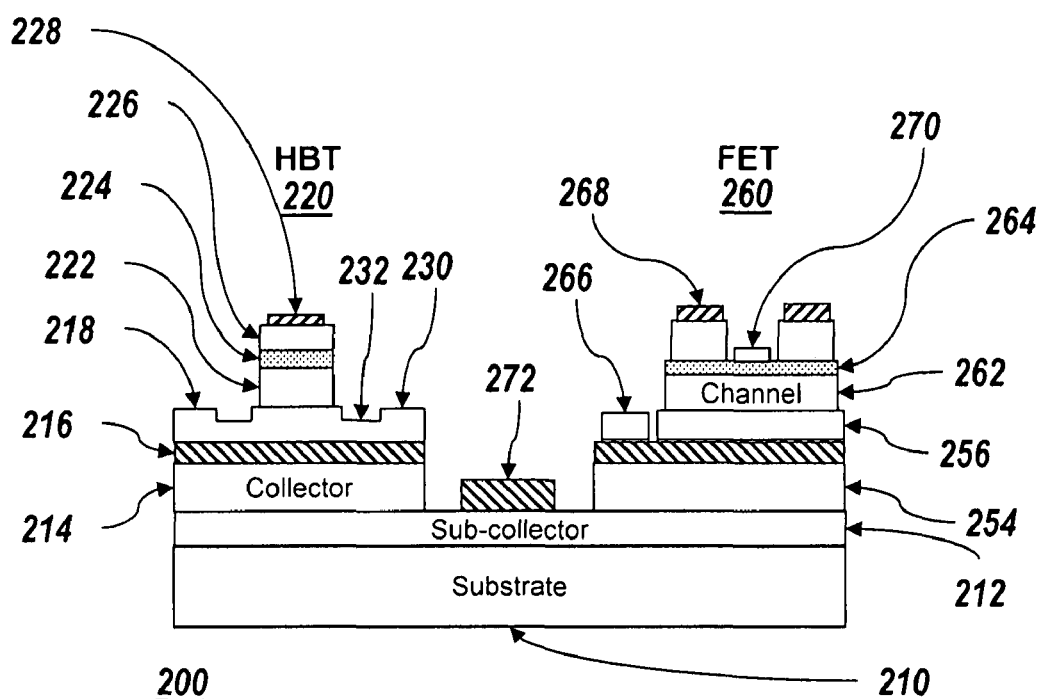
FIG. 2 is a cross-sectional view of an illustrative BiFET device.

FIG. 2 depicts a cross-sectional view of an illustrative BiFET device 200. BiFET device 200 integrates HBT device 220 and FET device 260 on a common substrate 210. In the illustrative BiFET 200, HBT 220 is grown adjacent to FET 260. It is also possible to grow an HBT device on top of a FET device using the methodologies described herein.

The illustrative BiFET 200 includes a sub-collector layer 212 and a collector layer 272 formed on substrate 210. The illustrative HBT 220 includes a collector layer 214, a base 216, collector electrodes 218 and 230, an emitter 222, a contact 224, a contact layer 226, and an emitter electrode 228. The illustrative FET 260 includes a collector layer 254, a base 256, a channel 262, an etch stop layer 264, a terminal 266, a source terminal 268, and gate terminal 270. The device shown in FIG. 2 is an illustrative example of a BiFET. Those skilled in the art will recognize that other embodiments are possible.

Figure 3:
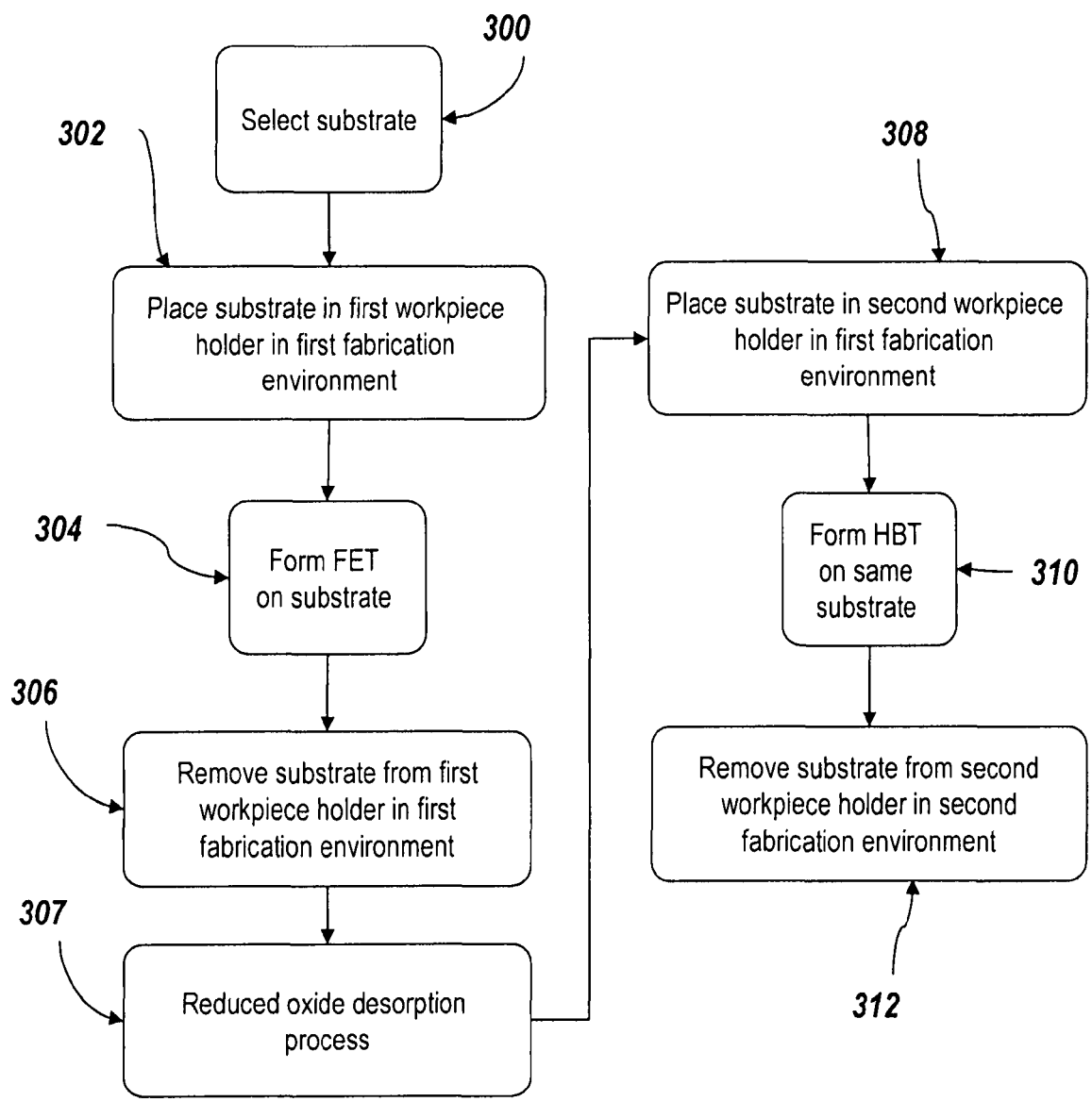
FIG. 3 is a flowchart depicting steps taken to form a BiFET device in accordance with the teachings of the current invention.
Figure 4:
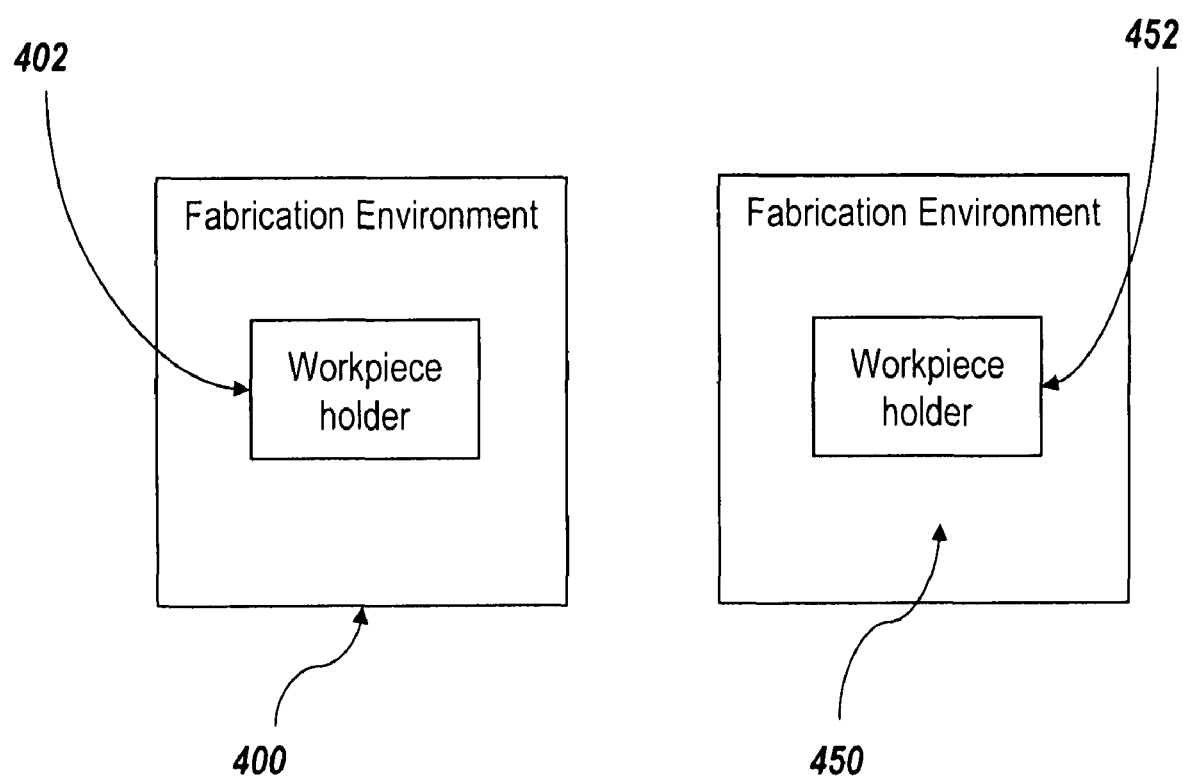
FIG. 4 depicts a suitable setup for fabricating a BiFET device in accordance with the teachings of the present invention.

FIG. 3 is a flow chart depicting the steps taken to form a BiFET in accordance with the teachings of the present invention. FIG. 3 is discussed in relation to FIG. 4, which depicts exemplary fabrication environments suitable for use in fabrication of a BiFET device according to the teachings disclosed herein. In step 300, the substrate 121 is selected. In step 302, the substrate 121 is placed on a workpiece holder 402 in a first fabrication environment 400. In step 304, the layers or regions of the FET 120 are formed in the first fabrication environment 400. The first fabrication environment 400 may be a molecular beam epitaxy (MBE) environment or a metal-organic chemical vapor deposition (MOCVD) environment, or any other environment suitable for epitaxial growth. In step 306, the FET 120 is removed from first fabrication environment 400. At this point, a number of intermediate steps may occur (e.g., cleaning of the FET 120, testing of the FET 120, etc.). According to one embodiment, step 307 is performed. Step 307 is a reduced oxide desorption process. The temperature of the substrate in step 307 is lowered by between about 50-100° C., which in turn reduces the degradation of the FET device.

In step 308, the FET 120 is placed on a workpiece holder 452 in second fabrication environment 450. In step 310 the HBT 130 is grown on the same substrate 121 as FET 120. In step 312, the completed BiFET 100 is removed from second fabrication environment 602.

The first fabrication environment 400 and the second fabrication environment 450 are of different types. The HBT 130 and the FET 120 of the BiFET 100 are monolithically integrated on a common substrate 121 using two separate growth procedures in two separate environments. The BiFET 100 may be fabricated in accordance with the teachings of the present invention without inducing performance degradation to either its FET 120 or its HBT 130.

A BiFET device 100 fabricated in accordance with the teachings of the present invention can have any desired number of layers and shapes, any desired number of dopants, any desired doping concentrations, any desired compositions, any desired material and dopant types or combination of such structural elements that establish the operational characteristics of either the FET device 120, the HBT device 130, or both.

FIG. 5 illustrates one example of a BiFET device fabricated in accordance with the teachings of the present invention. The BiFET device 500 includes a FET device 530 (a pHEMT device) integrated with an HBT device 532. GaAs substrate 501 has a thickness of about 20 nm and serves as a common substrate for the FET device 530 and HBT device 532.

The FET device 530 includes superlattice buffer layers 502 and 503, a transition layer 504, a donor layer 505, a spacer layer 506, a channel 507, a spacer layer 508, a donor layer 509, a Schottky layer 510, an etch stop layer 511, and contact layers 512 and 513. HBT device 532 includes collector layers 516-519, base layer 520, emitter layer 521, and contact layers 522 and 523.

Superlattice buffer layer 502 is formable from a GaAs material and has a thickness of about 1.5 nm. Superlattice buffer layer 503 is formable from an $Al_xGa_{1-x}As$ material ($0 \leq x \leq 0.5$; in one embodiment, $x=0.24$) and has a thickness of about 20 nm. Superlattice buffer layers 502 and 503 may be repeated a number of times, for example, ten times.

The transition layer 504 is formable from an $Al_xGa_{1-x}As$ material ($0 \leq x \leq 1$; in one embodiment, $x=0.24$) and has a thickness between about 10 nm and 1000 nm. In one embodiment, the transition layer has a thickness of about 20 nm.

The donor layer 505 is an n-type layer formed from an $Al_xGa_{1-x}As$ material ($0 \leq x \leq 0.35$; in one embodiment, $x=0.24$) and has a thickness of between about 10 and 50 nm. In one embodiment, the donor layer has a thickness of about 20 nm. The donor layer 505 is Si-doped, with a concentration between about $1.00 \times 10^{18}$ and $5.00 \times 10^{18}$ $cm^{-3}$. In one embodiment, the donor layer was doped with a concentration of about $2.00 \times 10^{18}$ $cm^{-3}$.

The spacer layer 506 is formable from an $Al_xGa_{1-x}As$ material ($0 \leq x \leq 0.35$; in one embodiment, $x=0.24$) and has a thickness between about 1 and 5 nm. In one embodiment, the spacer layer had a thickness of about 2 nm. The spacer layer 508 is formable from an $Al_xGa_{1-x}As$ material ($0 \leq x \leq 0.35$; in one embodiment, $x=0.24$) and has a thickness between about 1 and 5 nm. In one embodiment, the spacer layer has a thickness of about 2 nm.

The channel layer 507 is formable from an $In_xGa_{1-x}As$ material ($x \leq 0.23$; in one embodiment, $x=0.16$) and has a thickness of between about 8 and 15 nm. In one embodiment, the channel layer has a thickness of about 12 nm.

The donor layer 509 is an n-type layer formable from an $Al_xGa_{1-x}As$ material ($0 \leq x \leq 0.35$; in one embodiment, $x=0.24$) and has a thickness of between about 10 and 50 nm. In one embodiment, the donor layer has a thickness of about 12 nm. The donor layer 509 is Si-doped, with a concentration between about $1.00 \times 10^{18}$ and $5.00 \times 10^{18}$ $cm^{-3}$. In one embodiment, the donor layer has a dopant concentration of about $2.00 \times 10^{18}$ $cm^{-3}$.

The Schottky layer 510 is formable from an $Al_xGa_{1-x}As$ material ($0 \leq x \leq 0.35$; in one embodiment, $x=0.24$) and has a thickness of between about 10 and 100 nm. In one embodiment, the Schottky layer has a thickness of about 20 nm.

The etch stop layer 511 is formable from AlAs and has a thickness of up to about 50 nm. In one embodiment, the etch stop layer has a thickness of about 20 nm.

The contact layer 512 is an n-type layer with a thickness of up to about 100 nm. In one embodiment, the contact layer has a thickness of about 20 nm. The contact layer is Si-doped with a dopant concentration between about $1.00 \times 10^{17}$ and $5.00 \times 10^{17} cm^{-3}$. In one embodiment, the contact layer has a dopant concentration of $3.00 \times 10^{17} cm^{-3}$. The contact layer 513 is an n-type layer formable from GaAs, and is Si-doped with a dopant concentration between about $1.00 \times 10^{18}$ and $5.00 \times 10^{18} cm^{-3}$. In one embodiment, the contact layer has a dopant concentration of about $2.00 \times 10^{18} cm^3$. The contact layer has a thickness of up to about 100 nm. In one embodiment, the contact layer has a thickness of about 50 nm.

Formation of the HBT device 532 begins with layer 514. The collector layers 542 include collector layers 516-518, each an n-type Si-doped layer formable from a GaAs material. The dopant concentrations for layers 516, 517, 518, are about $3.00 \times 10^{18}$ $cm^{-3}$, about $5.00 \times 10^{16}$ $cm^{-3}$, about $1.00 \times 10^{6}$ $cm^{-3}$. The thickness of each layer is about 600 nm, about 400 nm, and about 100 nm, respectively. The thickness of the sub-collector layer 516 can be up to 1000 nm at a doping level range of $1.00 \times 10^{18}$ $cm^{-3}$ to $5.00 \times 10^{18}$ $cm^{-3}$. The thickness of the collector layer 517 and 518 can be up to 3000 nm at doping level range of about $5.00 \times 10^{15}$ $cm^{-3}$ to $8.00 \times 10^{17}$ $cm^{-3}$.

The base layer 519 is C-doped with a typical thickness of about 100 nm and a doping level of about $4.00 \times 10^{19}$ $cm^{-3}$. The thickness of the base layer can range from about 10 nm to 1000 nm and the doping level from about $5.00 \times 10^{18}$ $cm^{-3}$ to $2.00 \times 10^{20}$ $cm^{-3}$.

The emitter layer 520 is an n-type layer formable from an InGaP material, and is Si-doped at a dopant concentration of about $3.00 \times 10^{17}$ $cm^{-3}$. The thickness of the emitter layer can range from about 10 to 100 nm with a doping range of about $1.00 \times 10^{17}$ $cm^{-3}$ to $1.00 \times 10^{18}$ $cm^{-3}$.

The contact layer 521 has a thickness of about 100 nm and is doped at about $4.00 \times 10^{18}$ $cm^{-3}$. The contact layer thickness can range from about 10 nm to 500 nm. Contact layers 522 and 523 are both n-type layers formable from an about 60% InGaAs material. The contact layers 522 and 523 each have a thickness of about 50 nm. Both of the contact layers 522 and 523 are Te-doped at a concentration of less than about $1 \times 10^{19}$ $cm^{-3}$. The thickness of the contact layer can range up to about 200 nm, with a composition of up to about 80% InGaAs and doping level range of about $5.00 \times 10^{18}$ $cm^{-3}$ to $3.00 \times 10^{19}$ $cm^{-3}$. The contact layers 521, 522 and 523 form contact layer group 544.

FIG. 6 shows empirical data of a BiFET device fabricated in accordance with the teachings of the present invention. The uniformity of the HBT device characteristics across a 4-inch wafer may be characterized as excellent. The gains achieved in the BIFET are nearly identical to the results obtained for HBT devices of the same or a similar stackup formed independently (i.e., without a FET) on top of a GaAs substrate. This demonstrates that a BiFET device fabricated according to the disclosed method performs as well as individually grown HBT devices with the same or a similar stackup.

FIG. 7 depicts another exemplary stack up of an illustrative BiFET device 700, made up of a composite collector HBT device 750 and a FET device 760. BiFET device 700 was formed in accordance with the teachings of the present invention. The performance of the BiFET device illustrated in FIG. 7 is illustrated in FIGS. 8-11. To achieve the BiFET device 700 shown in FIG. 7, a FET device 760 was first formed in a first fabrication environment, then an HBT device 750 was formed in a second fabrication environment on the same substrate as the FET device 760.

BiFET device 700 includes a substrate 702, a buffer 704, a transition layer 706, a donor layer 708, a spacer 710, a channel 712, a spacer 714, a donor layer 716, a Schottky layer 718, a contact layer 720, a cap layer 722, an etch stop layer 724, a sub-collector 726, a collector region 727, a collector region 728, a base layer 730, an emitter 732, a contact layer 734, and a contact layer 736.

The following description provides an exemplary embodiment. Those skilled in the art will realize that a variety of thicknesses and a variety of materials can be utilized according to the teachings of the present invention.

The substrate 702 is formed from a GaAs material. The buffer 704 is about 200 nm thick and is formed from a GaAs material. The transition layer 706 is about 20 nm thick and is formed from a $Al_{0.24}Ga_{0.76}As$ material. The donor layer 708 is about 6 nm thick and is formed from a $Al_{0.24}Ga_{0.76}As$ material. The donor layer 708 is Si-doped with a concentration of about $2\times10^{18}$ $cm^{-3}$. The spacer 710 is about 2 nm thick and formed from a $Al_{0.24}Ga_{0.76}As$ material. The channel 712 is about 12 nm thick, and is formed from an $In_{0.15}Ga_{0.85}As$ material. The spacer 714 is about 2 nm thick, and is formed from a $Al_{0.24}Ga_{0.76}As$ material. The donor layer 716 is about 12 nm thick, and is formed from an $Al_{0.24}Ga_{0.76}As$ material. The donor layer 716 is Si-doped with a concentration of about $2\times10^{18}$ $cm^3$. The Schottky layer 718 is about 20 nm thick, and is formed from a $Al_{0.24}Ga_{0.76}As$ material. The contact layer 720 is about 20 nm thick, and is formed from a GaAs material. The contact layer 720 is Si-doped with a concentration of about $3\times10^{17}$ $cm^{-3}$. The cap layer 722 is about 50 nm thick, and is formed from a GaAs material. The cap layer 722 is Si-doped with a concentration of about $4\times10^{18}$ $cm^{-3}$. The etch stop layer 724 is about 20 nm thick, and is formed from an InGaP material. The etch stop layer 724 is undoped. The sub-collector 726 is about 500 nm thick, and is formed from a GaAs material. The sub-collector 726 is Si-doped with a concentration of about $4\times10^{18}$ $cm^{-3}$.

The collector regions 727 and 728 are both about 400 nm thick, and both are formed from GaAs materials. The dopant concentration of the collector region 727 is about $1\times10^{16}$ $cm^{-3}$. The dopant concentration of layer 728 is about $5\times10^{15}$ $cm^{-3}$. Together, the collector regions 727 and 728 make up the composite collector 740. The base 730 is about 80 nm thick, and is formed from a GaAs material. The emitter 732 is about 50 nm thick, and is formed from a InGaP material. The emitter 732 is Si-doped with a concentration of about $3\times10^{17}$ $cm^{-3}$. The contact layer 734 is about 50 nm thick, and is formed from a GaAs material. The contact layer 734 is heavily Si-doped, with a concentration greater than about $10^{19}$ $cm^{-3}$. The contact layer 736 is a about 100 nm thick, and is formed from an InXGa1-xAs material. The contact layer 736 is heavily Te-doped, with a concentration greater than about $10^{19}$ $cm^{-3}$.

Figures 8, 9:
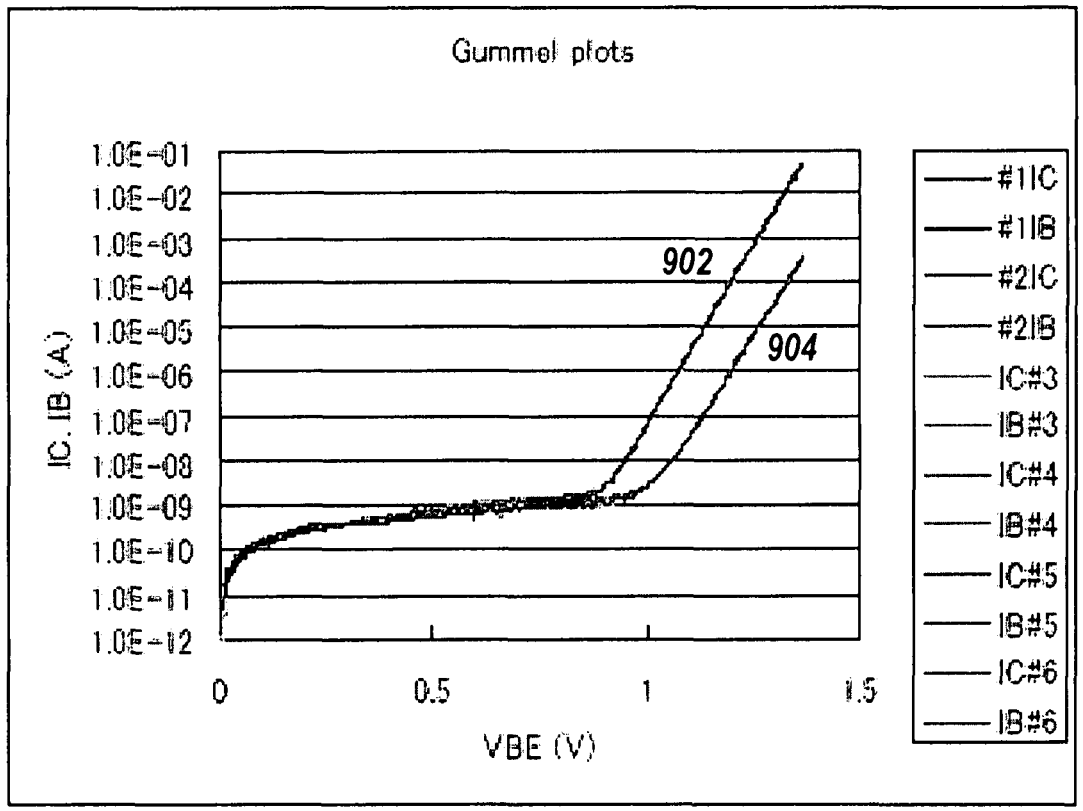
FIG. 8 depicts Hall mobility performance and Hall Sheet Resistance data for the stack up in FIG. 7 before and after formation of the HBT device structure.
FIG. 9 depicts a Gummel plot of the HBT portion on the BiFET device of FIG. 7.

FIG. 8 depicts Hall mobility and Hall Sheet resistance characteristics for the FET portion of the BiFET device 700. The operational characteristics for the FET portion 760 were measured at about 300K and at about 77K before and after formation of the HBT portion 750 of the BiFET 700. As can bee seen from this data, at about 300K there was no observable degradation in the Hall mobility and Hall sheet resistance of the FET portion 760 after formation of the HBT portion 750 of the BiFET 700. Likewise, Hall mobility and Hall sheet resistance measurements of the FET portion 760 of the BiFET 700 at 77K showed no observable degradation.

According to one embodiment of the invention, the temperature of the substrate during the formation of a collector and/or a subcollector is lowered by about 30° C. to about 100° C. (from conventional growth temperatures) during the forming of the HBT. According to one embodiment, a reduced oxide desorption process was also applied, where the temperature of the substrate was lowered by about 50-100° C. between the formation of the FET and the formation of the HBT to reduce the degradation of the FET device. Conventionally, the substrate temperature during the growth cycle of the HBT is between about 600° C. and 700° C.

As shown in FIG. 8, when the fabrication temperature is lowered, the Hall Mobility and Hall sheet resistance of the FET portion 760 of the BiFET 700 does not degrade. The resulting improvement is comparable to a stand alone FET device that is not integrated with an HBT device.

Figure 10:
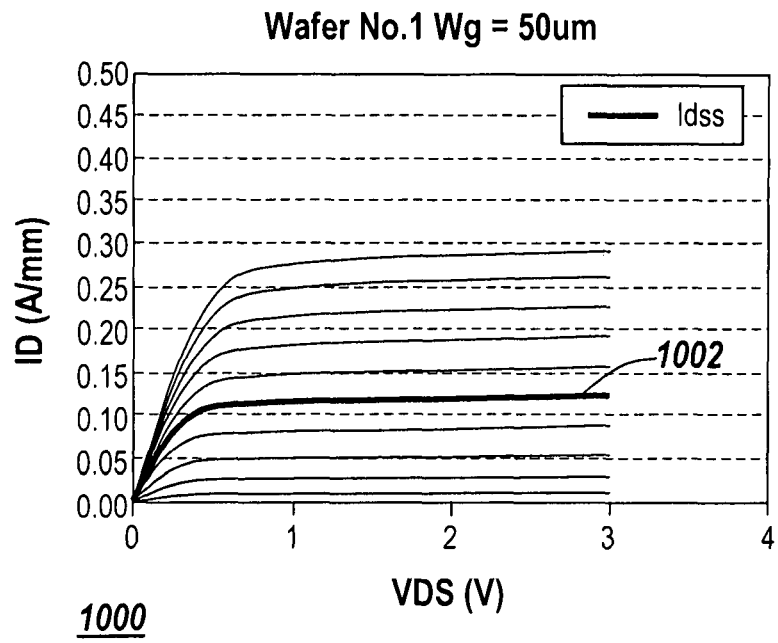
FIG. 10 depicts the operational characteristics of the FET portion of the BiFET device of FIG. 7.

FIG. 9 depicts a Gummel plot of the HBT devices (L=2×20 $\mu m^2$) on the BiFET device 700. Current is depicted on the Y axis, with emitter voltage depicted on the X axis. The DC current gain is 120 (L=2×20 um2). Actual test measurements verify that the DC current gain of the BiFET 700 match the DC current gain of a standalone InGaP HBT (i.e., not integrated with a FET on a common substrate). The base current of the HBT device is nearly identical to the base current of the HBT device that was grown independently—that is, not monolithically integrated with a FET on a common substrate. Recombination analysis of the base emitter junction of the HBT device that was monolithically integrated with a FET on a common substrate showed the same characteristics as the HBT device that was grown independently FIG. 10 depicts the FET characteristics of the BiFET device 700. FIG. 10 shows the output characteristics of the FET device 760 (Lg=0.5 um). Vgs values are in 0.1 V steps. Idss denotes where Vgs=0 V. The Vgs ranges from +0.5 V (top) to −0.5 V (bottom). Current is represented on the Y axis, with voltage on the X. The transconductance is about 300 mS/mm, which is directly comparable to the results in a conventional FET (i.e., a FET that is not formed as part of a BiFET). This indicates that the FET performance did not degrade as a result of fabrication of HBT 750 on the same substrate as FET 760. The Ron resistance of the FET 760 was 1.3 ohm-mm, which was the same as the original FET without an HBT monolithically integrated thereto on a common substrate. A low Ron resistance is highly desirable for switching applications and low noise performance.

Figure 11:
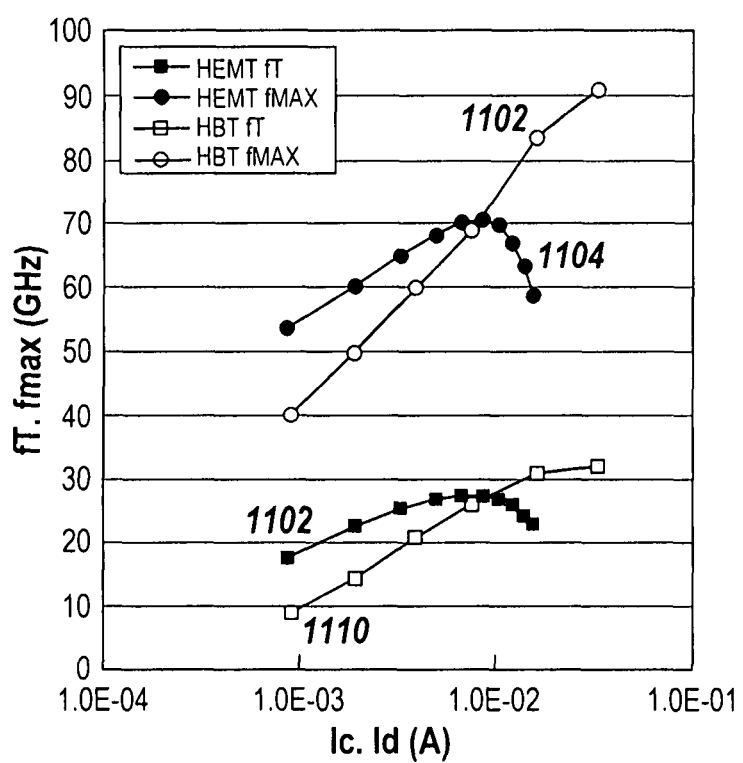
FIG. 11 depicts the operational characteristics of the HBT portion and FET portion on the BiFET device of FIG. 7.

FIG. 11 graphically depicts the performance of the HBT and FET on the BiFET device 700. The FET and HBT Ft and Fmax are measured values directly comparable to the results achieved on a FET and an HBT, separately formed and not monolithically integrated on a common substrate.

The data in FIGS. 8-11 shows that the performance of the BiFET 700 is comparable to the performance of individual HBT and FET devices. Thus, utilizing the methodologies taught herein, the present invention optimizes the performance of a BiFET device.

Although the present invention has been described with respect to specific embodiments thereof, various changes and modifications can be carried out by those skilled in the art without departing from the scope of the invention. The present invention may, for instance, be fabricated with any number of layers, from any of the various semiconductor compounds, using any of a number known processing techniques. Therefore, it is intended that the present invention encompass such changes and modifications to the described embodiments as fall within the scope of the appended claims.

What is claimed is:
1. A method of fabricating a BiFET device, the method comprising the steps of:
 loading a substrate into a first fabrication environment;
 forming a FET portion of the BiFET device on the substrate in the first fabrication environment;

removing the substrate from the first fabrication environment after formation of the FET portion of the BiFET device;

loading the substrate in a second fabrication environment; and forming a HBT portion of the BiFET device on the substrate in the second fabrication environment, wherein the temperature is lowered to between 30° C. and 100° C. during the forming of the HBT portion of the BiFET device.

2. A method according to claim 1 wherein the FET portion of the BiFET device is substantially free of contamination from impurities introduced during formation of the HBT portion of the BiFET device.

3. A method according to claim 1 wherein the FET device is an HFET.

4. A method according to claim 3 wherein the HFET is a pHEMT.

5. A method according to claim 1 wherein the first fabrication environment is one of a molecular beam epitaxy or a metal-organic chemical vapor deposition reactor.

6. A method according to claim 1 wherein the second fabrication environment is one of a molecular beam epitaxy or a metal-organic chemical vapor deposition reactor.

7. A method according to claim 1 wherein the first fabrication environment and the second fabrication environment are of different types.

8. A method according to claim 1 wherein the substrate is one of a GaAs or InP substrate.

9. A method according to claim 1 wherein the temperature is lowered during the formation of a collector region of the HBT portion of the BiFET device.

10. A method according to claim 1 wherein the temperature is lowered during the formation of a collector region of the HBT portion of the BiFET device.

11. A method according to claim 1 wherein the temperature during an oxide desorb process is lowered by at least 50° C. prior to the growth of a subcollector region.

12. A BiFET device fabricated according the method of claim 1.

13. A method of fabricating a BiFET device, the method comprising the steps of:

loading a substrate into a first fabrication environment;

forming a FET portion of the BiFET device on the substrate in the first fabrication environment;

removing the substrate from the first fabrication environment after formation of the FET portion of the BiFET device;

loading the substrate in a second fabrication environment; and forming a HBT portion of the BiFET device on the substrate in the second fabrication environment, wherein the temperature is lowered during the forming of the HBT portion of the BiFET device, and wherein the temperature during an oxide desorb process is lowered by at least 50° C. prior to the growth of a subcollector region.

14. A method according to claim 13 wherein the FET portion of the BiFET device is substantially free of contamination from impurities introduced during formation of the HBT portion of the BiFET device.

15. A method according to claim 13 wherein the FET device is an HFET.

16. A method according to claim 15 wherein the HFET is a pHEMT.

17. A method according to claim 13 wherein the first fabrication environment is one of a molecular beam epitaxy or a metal-organic chemical vapor deposition reactor.

18. A method according to claim 13 wherein the second fabrication environment is one of a molecular beam epitaxy or a metal-organic chemical vapor deposition reactor.

19. A method according to claim 13 wherein the first fabrication environment and the second fabrication environment are of different types.

20. A method according to claim 13 wherein the substrate is one of a GaAs or InP substrate.

21. A method according to claim 13 wherein the temperature is lowered during the formation of a collector region of the HBT portion of the BiFET device.

22. A method according to claim 13 wherein the temperature is lowered to between 30° C. and 100° C.

23. A method according to claim 22 wherein the temperature is lowered during the formation of a collector region of the HBT portion of the BiFET device.

24. A BiFET device fabricated according the method of claim 13.

* * * * *